(12) United States Patent
Aoki

(10) Patent No.: US 7,871,502 B2
(45) Date of Patent: Jan. 18, 2011

(54) METHOD FOR MANUFACTURING CHALCOPYRITE THIN-FILM SOLAR CELL

(75) Inventor: Satoshi Aoki, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 1107 days.

(21) Appl. No.: 11/568,776

(22) PCT Filed: Apr. 12, 2005

(86) PCT No.: PCT/JP2005/007098

§ 371 (c)(1),
(2), (4) Date: Nov. 7, 2006

(87) PCT Pub. No.: WO2005/109525

PCT Pub. Date: Nov. 17, 2005

(65) Prior Publication Data
US 2008/0283389 A1    Nov. 20, 2008

(30) Foreign Application Priority Data
May 11, 2004   (JP)   .............................. 2004-140703

(51) Int. Cl.
*C23C 14/34* (2006.01)
*H01L 25/00* (2006.01)
(52) U.S. Cl. .......................... 204/192.26; 204/192.15; 204/192.29; 136/243; 136/252; 136/256; 136/260; 136/262; 136/264; 136/265

(58) Field of Classification Search ............ 204/192.15, 204/192.26, 192.29; 136/243, 252, 256, 136/260, 262, 264, 265
See application file for complete search history.

(56) References Cited

U.S. PATENT DOCUMENTS

2005/0028861 A1 *   2/2005   Aoki et al. .................. 136/256

FOREIGN PATENT DOCUMENTS

WO    WO 03/069684    *   8/2003

* cited by examiner

*Primary Examiner*—Rodney G McDonald
(74) *Attorney, Agent, or Firm*—Rankin, Hill & Clark LLP

(57) ABSTRACT

A method for fabricating a chalcopyrite-type thin film solar cell includes a first step of forming onto a Mo electrode layer 2 a precursor including an In metal layer and a Cu—Ga alloy layer by sputtering, a second step of attaching an alkali-metal solution onto the precursor, a selenization step of subjecting the substrate 1 which has undergone both the first and the second steps to a selenization treatment, and a transparent electrode forming step of depositing an optically transparent conductive layer. As the alkali-metal solution, an aqueous solution of an alkali metal compound, such as sodium tetraborate, sodium sulfide, and sodium aluminum sulfate, can be used.

5 Claims, 7 Drawing Sheets

METHOD FOR MANUFACTURING CHALCOPYRITE THIN-FILM SOLAR CELL

TECHNICAL FIELD

The present invention relates to a method for fabricating a chalcopyrite-type thin-film solar cell whose light absorbing layer comprises a chalcopyrite-type compound layer.

BACKGROUND ART

Solar cells can be broadly classified into types which include silicon solar cells, thin-film solar cells and compound solar cells. Among these, progress is being made in the commercial development of thin-film solar cells as an optical device applying thin-film technology due to the advantages that their fabrication process is simple and does not require much energy. Chalcopyrite-type thin-film solar cells are categorized as thin-film cells, and comprise a CIGS layer consisting of a chalcopyrite-type compound ($Cu(In+Ga)Se_2$: CIGS) as a p-type light absorbing layer. By using a light absorbing layer formed with such a compound, and in particular when employed together with an alkali-metal-containing glass substrate, such as soda lime glass, it is known that the solar cell can attain a high photoelectric conversion efficiency. Furthermore, such a cell is not only highly reliable due to a significantly reduced photodegradation (progressing over time), which is caused by contamination or lattice defects, photosensitive over a broad range of absorption wavelengths including longer wavelength bands, and at a high level in absorption coefficient but also highly radiation resistant, whereby its research and development aimed at mass practical application is progressing.

The layer structure of a typical thin-film solar cell which comprises a CIGS layer as its light absorbing layer is illustrated in FIG. 1. Such a solar cell is constituted by, on a soda lime glass (SLG) substrate 1, a multi-layered structure 7, which comprises a backside electrode layer 2 consisting of a Mo metal layer which serves as the positive electrode, a dipped Na layer 3 for preventing Na unevenness originating from the SLG substrate 1, the above-mentioned CIGS light absorbing layer 4, an n-type buffer layer 5 and a transparent conductive electrode 6 serving as the negative electrode on the outermost layer.

When sunlight or some other light is incident on an upper light receiving portion of such a solar cell, pairs of an electron and a hole are generated near the p-n junction of the multi-layered structure 7, since it is excited by the irradiated light having a energy higher than the bandgap. The excited electron and hole arrive at the p-n junction by diffusion, whereby due to the internal electric field of the junction, electrons collect at the n region and holes collect at both the p regions, and are thereby separated. As a result, the n region has a negative charge and the p region a positive charge, thus causing an electric potential difference between the electrodes 8 and 9 provided in the respective regions. This electric potential difference acts as an electromotive force, whereby a photo-current is achieved when a conductor is connected between the respective electrodes. This is the principle of solar cells.

FIG. 2 is a process diagram illustrating the fabrication steps of a chalcopyrite-type thin-film solar cell having the multi-layered structure illustrated in FIG. 1.

When fabricating the above-mentioned solar cell, a Mo electrode layer is deposited (Mo electrode layer deposition step: FIG. 2a) by sputtering a metal Mo target onto a clean glass substrate of SLG or the like.

Subsequently, each substrate formed with a Mo electrode layer is divided up into a desired size by laser cutting. (first scribing step: FIG. 2b).

Next, the substrate is cleaned by washing with water or the like to remove the shavings and other debris, followed by dipping the cleaned substrate in a dilute solution of an alkali metal compound, such as sodium sulfide (alkali metal compound adhesion step: FIG. 2c). A bilayer structure consisting of an In metal layer and a Cu—Ga alloy layer is then deposited by sputtering both an In metal target and a Cu—Ga alloy target (a deposition step of precursor for a light absorbing layer: FIG. 2d).

As illustrated in FIG. 2e, in a conventional method for obtaining a CIGS light absorbing layer, for example, whole substrates, each having an In layer and a Cu—Ga alloy layer which constitutes the precursor of the CIGS layer is contained in an annealing chamber, wherein the substrates are preheated at 100° C. for 10 minutes. After preheating, the temperature in the chamber is elevated to the temperature range of 500 to 520° C. while hydrogen selenide ($H_2Se$) gas is charged into the chamber via a gas inlet tube inserted thereinto and circulates in the annealing chamber. By such an annealing treatment, the precursor consisting of a layered structure of an In layer and a Cu—Ga alloy layer is transformed into a CIGS mono-layer, during which time the dipped Na layer diffuses into the light absorbing layer and disappears. Once the thermal treatments are completed, the hydrogen selenide reaction gas is displaced by a purging gas, such as Ar, and the annealed workpiece is cooled (see Patent Document 1).

A CIGS layer deposited substrate which has been removed from the annealing chamber then undergoes a buffer layer deposition using an n-type semiconductor material, such as CdS, Zno, InS or the like, by chemical bath deposition as illustrated in FIG. 2f or sputtering.

The substrate on which a buffer layer has been deposited is then cut using laser irradiation or a metal needle (second scribing step: FIG. 2g).

Subsequently, by sputtering using a ZnO—Al alloy target, a transparent conductive layer consisting of a ZnOAl layer is deposited as the outermost layer (FIG. 2h).

Finally, the substrate on which a transparent conductive layer has been deposited is again cut using laser irradiation or a metal needle (third scribing step: FIG. 2i).

The thin-film solar cell consisting of the above layered structure can be obtained as single cells whose size is uniform as a result of the cutting processing, whereby a final product can be made into a flat integrated structure by connecting such single cells in series.

As mentioned above, it is known that when a CIGS light absorbing layer is used in combination with an alkali-metal-containing glass substrate (e.g. an SLG substrate), a high photoelectric conversion efficiency can be attained. This phenomenon was shown to be from sodium atoms in the SLG diffusing into the light absorbing layer, thereby promoting particle growth in the layer. That is, when CIGS is employed as the light absorbing layer, $Cu(In+Ga)Se_2$ crystallization is promoted, whereby as a result of this an increase in the photoelectric conversion efficiency is achieved.

Examples of such a light absorbing layer formation technique which employs an alkali metal layer include the dry process described in Patent Documents 2 and 3. According to Patent Document 2, a predetermined amount of sodium selenide is precipitated using vapor deposition into the Mo metal layer of the backside electrode, and a CIGS semiconductor layer is formed on the top thereof by sputtering and annealing, whereby sodium is doped into the semiconductor layer. On the other hand, Patent Document 3 discloses that, when co-depositing a Cu(In+Ga)Se chalcopyrite structure semiconductor component, a compound consisting of a group Ia element and a group VIa element, such as $Na_2Se$, $Na_2S$ or the like, is deposited simultaneously or in tandem, and then the annealing treatment is carried out.

However, in the light absorbing layer formation technique according to Patent Document 2, since the sodium selenide precipitated onto the Mo metal layer is hygroscopic, when exposed to the air after vapor-deposition the precipitated matter alters, which can cause peeling to occur between the backside electrode and the light absorbing layer. Furthermore, in the vapor deposition according to Patent Document 3, in addition to the problem of the alkali metal compound being hygroscopic, fresh problems arise, such as the increased size of the deposition apparatus and resultant cost increase for its equipment.

The above-mentioned problems are all peculiar to a dry process. To solve such problems, the present inventors proposed a wet process as described in Patent Document 4. FIG. 3 illustrates the outline of the light absorbing layer formation steps disclosed in Patent Document 4, wherein an alkali metal compound is formed by a wet process.

Explaining the light absorbing layer formation steps of Patent Document 4 by referring to FIG. 3, first, a Mo electrode layer is formed onto an SLG substrate by sputtering. Next, an alkali layer is formed onto the Mo electrode layer by dipping. The alkali layer is formed by dipping the substrate provided with a Mo electrode layer in an aqueous solution of 0.01 to 1% by weight of sodium sulfide dissolved in pure water, drying the dipped substrate by spin drying or the like, and then baking the dried substrate in air for 60 minutes to regulate the remaining moisture thereof. Subsequently, the alkali layer is subjected to sputter deposition using, in order, an In target followed by a Cu—Ga alloy target, whereby a layered precursor is formed consisting of an In metal layer and a Cu—Ga alloy layer. The substrate provided with a precursor layer is then subjected to a selenization treatment in a Se atmosphere having a predetermined temperature, whereby a CIGS light absorbing layer is formed. At this stage, the alkali layer disappears by diffusion into the light absorbing layer adjacent directly above.

Patent Document 1: Japanese Patent Laid-Open No. 2003-282908
Patent Document 2: Japanese Patent Laid-Open No. H08-222750
Patent Document 3: Japanese Patent Laid-Open No. H08-102546
Patent Document 4: WO 03/069684 (pamphlet)
Non-Patent Document 1: M. Bodegard et al., "The Influence of Sodium on the Grain Structure of CuInSe2 Films for Photovoltaic Applications", Proc. 12th Eur. Photovoltaic Solar Conf. 1994

By employing the wet process of Patent Document 4 in place of the dry processes of Patent Documents 2 and 3, the problems peculiar to dry processes, such as the alkali metal compound being hygroscopic and an increased apparatus size, can be resolved. However, on the other hand, when an aqueous solution having a higher concentration of the alkali metal compound is used in order to improve photoelectric conversion efficiency, when the concentration exceeds 1.0% by weight, the adhesion between the Mo electrode layer and the CIGS light absorbing layer decreases, whereby degradation over time, such as layer peeling, is more likely to occur.

Furthermore, in a light absorbing layer which has an alkali layer as the next layer between itself and the Mo electrode layer, stain spots sometimes appear on the surface thereof after the precursor forming step and selenization step. For this reason there is the problem that the external appearance of a thin-film solar cell fabricated by undergoing a transparent electrode forming step is significantly blemished, whereby its commercial value decreases.

It is an object of the present invention to provide a method for fabricating a chalcopyrite-type thin-film solar cell, which has good adhesion between the electrode layer and the CIGS light absorbing layer, and which has a stable layered structure and does not have any problems with its external appearance even when the concentration of an alkali-metal solution for forming an alkali layer, whose purpose is to improve photoelectric conversion efficiency, is comparatively high.

DISCLOSURE OF INVENTION

It can be inferred that the above-mentioned phenomena of inter-layer peeling and stain spots caused by using an aqueous solution of an alkali metal compound in a comparatively high concentration are caused by crystal particle growth during the selenization process progressing more than what was expected. Specifically, it is thought that excessive growth of the CIGS crystal particles causes localized stress concentration at the boundary between the electrode layer and the light absorbing layer, thereby resulting in a decrease in adhesion between the two layers. It is also thought that slight adhesion unevenness of the alkali-metal-containing aqueous solution to the electrode layer develops into stain spots on the surface of the thin-film solar cell, through excessively grown crystal particles.

In view of this, the chalcopyrite-type thin-film solar cell according to the present invention, which is directed to resolving the above-mentioned problems, comprises a first step of forming a precursor comprising an In, Cu and Ga metal elements onto a backside electrode layer provided on a substrate, a second step of attaching an alkali-metal solution onto the precursor, a selenization step of heat-treating the substrate which has undergone both the first and the second steps in a hydrogen selenide atmosphere, and a transparent electrode forming step of depositing an optically transparent conductive layer.

According to the present invention, since the alkali metal component which promotes CIGS crystal growth is attached to the precursor on the side opposite to the backside electrode layer, crystal growth in the precursor layer is suppressed near the electrode layer. Thus, even when the concentration of the alkali-metal solution is made comparatively high, stress concentration at the boundary between the electrode layer and the light absorbing layer is prevented, thereby enabling a layered structure having long-term stability to be attained. Since the alkali metal component is attached to the precursor on the side opposite to the backside electrode layer, stain spots are no longer visible in appearance, which otherwise would be formed by excessive crystal growth caused by uneven attachment of the alkali.

Therefore, a thin-film solar cell obtained after subsequently undergoing a transparent electrode forming step has a stable inter-layer structure, and exhibits an external appearance free from the appearance of stain spots.

Examples of a preferred solute for the alkali-metal solution include sodium tetraborate, sodium sulfide, and sodium aluminum sulfate.

The above-mentioned precursor forming step comprises a first sputter deposition step for forming an In metal layer and a second sputter deposition step for forming a Cu—Ga alloy layer. That is, it is preferred to, first, form an In metal layer on the backside electrode by sputtering an In target, and then form a Cu—Ga alloy layer by sputtering an Cu—Ga alloy target.

The above-mentioned precursor forming step is carried out to avoid placing the electrode layer metal Mo adjacent to the metal Ga film structure. The reason for this is that CIGS crystals are not obtained very well at the metal Mo and metal Ga boundary. That is, the Ga component is unevenly distributed in the electrode layer side as a result of differences in solid phase diffusion coefficient, wherein in many cases good adhesion between the light absorbing layer and the electrode layer cannot be achieved. As a result, the obtained thin-film solar cell is susceptible to internal peeling. In contrast, in the present invention, since the In metal layer/Cu—Ga alloy layer layered structure is formed in the precursor forming step, the inter-layer structure between the boundaries of the light absorbing layer and the electrode layer can be prevented from becoming unstable as a result of uneven distribution of the Ga component in the Mo electrode layer side.

Furthermore, the forming of the alkali layer in the second step of the present invention is to remove any influence which the glass substrate has on the alkali component diffusion. That is, in a conventional thin-film solar cell, the presence of the alkali layer overlaps with the diffusion of the alkali component from the glass substrate, whereby the diffusion effects of the alkali component derived from the glass substrate are not effectively employed. However, in the present invention, because the alkali layer is formed on the opposite side from the glass substrate, the diffusion effects of the glass-substrate-derived alkali component can be independently obtained.

Thus, the present invention can comparatively easily achieve an improvement in photoelectric conversion efficiency by appropriately varying the concentration of the alkali-metal solution, which forms the alkali layer, depending on the substrate material, which may be an alkali-containing glass, a low-alkali glass or the like.

EFFECTS OF THE INVENTION

In the method for fabricating a chalcopyrite-type thin-film solar cell according to the present invention, in order to form a light absorbing layer, a precursor comprising a component which contains In, Cu and Ga metallic elements is formed, an alkali-metal solution is attached to the precursor, and an alkali component is attached to the precursor on a side opposite to the backside electrode layer. Subsequently, a heat treatment is carried out in a hydrogen selenide gas atmosphere. At this stage, CIGS crystal growth is suppressed at the electrode layer side of the precursor layer. Furthermore, even when the concentration of the alkali-metal solution is comparatively high, a stable layered inter-layer structure which does not change much over time can be obtained, and defects in external appearance from the manifestation of stain spots are less likely to occur.

In addition, an improvement in photoelectric conversion efficiency of a solar cell can be achieved by appropriately varying the concentration of the alkali-metal solution used as the alkali layer forming raw material depending on the alkali metal content of the substrate material, which may be an alkali-containing glass, a low-alkali glass or the like.

BEST MODE FOR CARRYING OUT THE INVENTION

Figure 1:
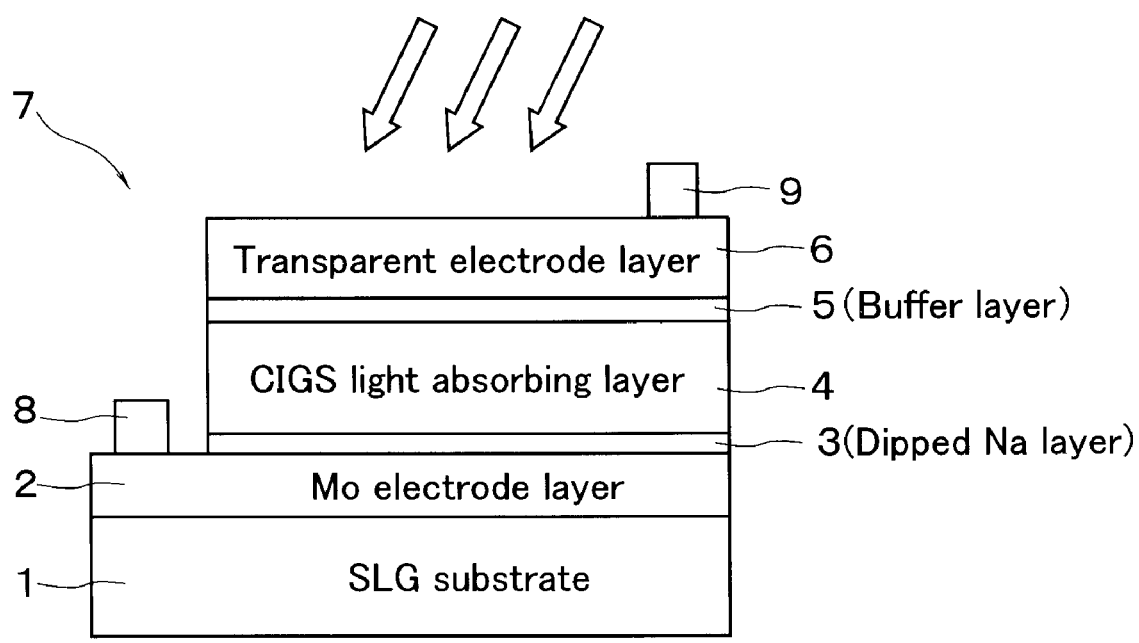
FIG. 1 is a schematic diagram illustrating the typical structure of a thin-film solar cell.
Figure 2:
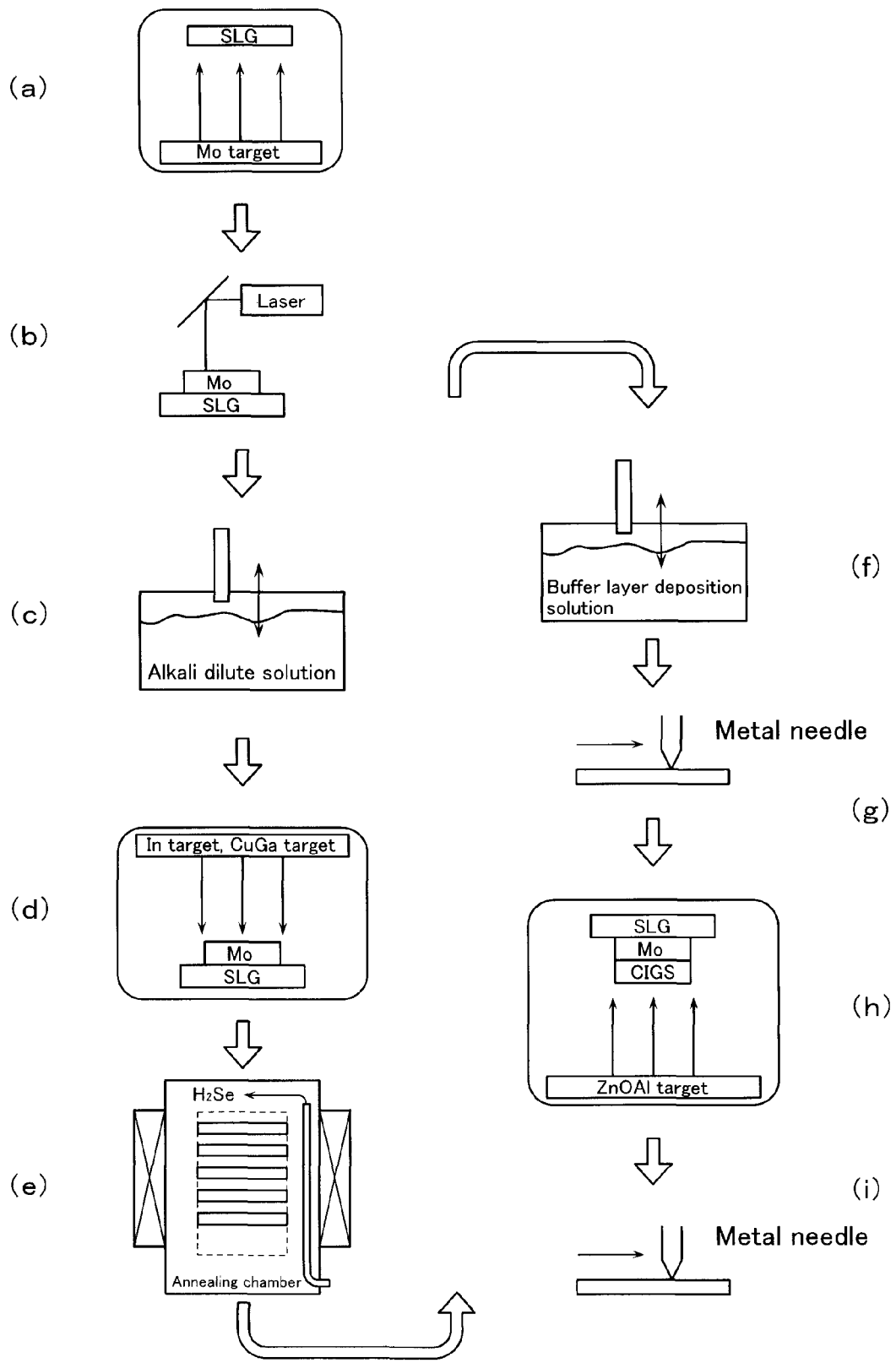
FIG. 2 is a typical production process diagram of a thin-film solar cell.

In the same manner as the structure illustrated in above-mentioned FIG. 1, a chalcopyrite-type thin-film solar cell fabricated according to the present invention comprises, on a substrate 1 of SLG glass or the like, a multi-layered structure 7 in which a Mo electrode layer 2, an alkali layer 3, a CIGS light absorbing layer 4, a buffer layer 5 and a conductive transparent electrode layer 6 are sequentially layered. Of these elements, depending on the case, the buffer layer 5 can be omitted. This thin-film solar cell is, depending on its layer structure, fabricated in accordance with the production process illustrated in FIG. 2. However, in the present invention, it should be noted that the order of the step of attaching an alkali-metal solution illustrated in FIG. 2*c* and the precursor deposition step illustrated in FIG. 2*d* are reversed.

Figure 4:
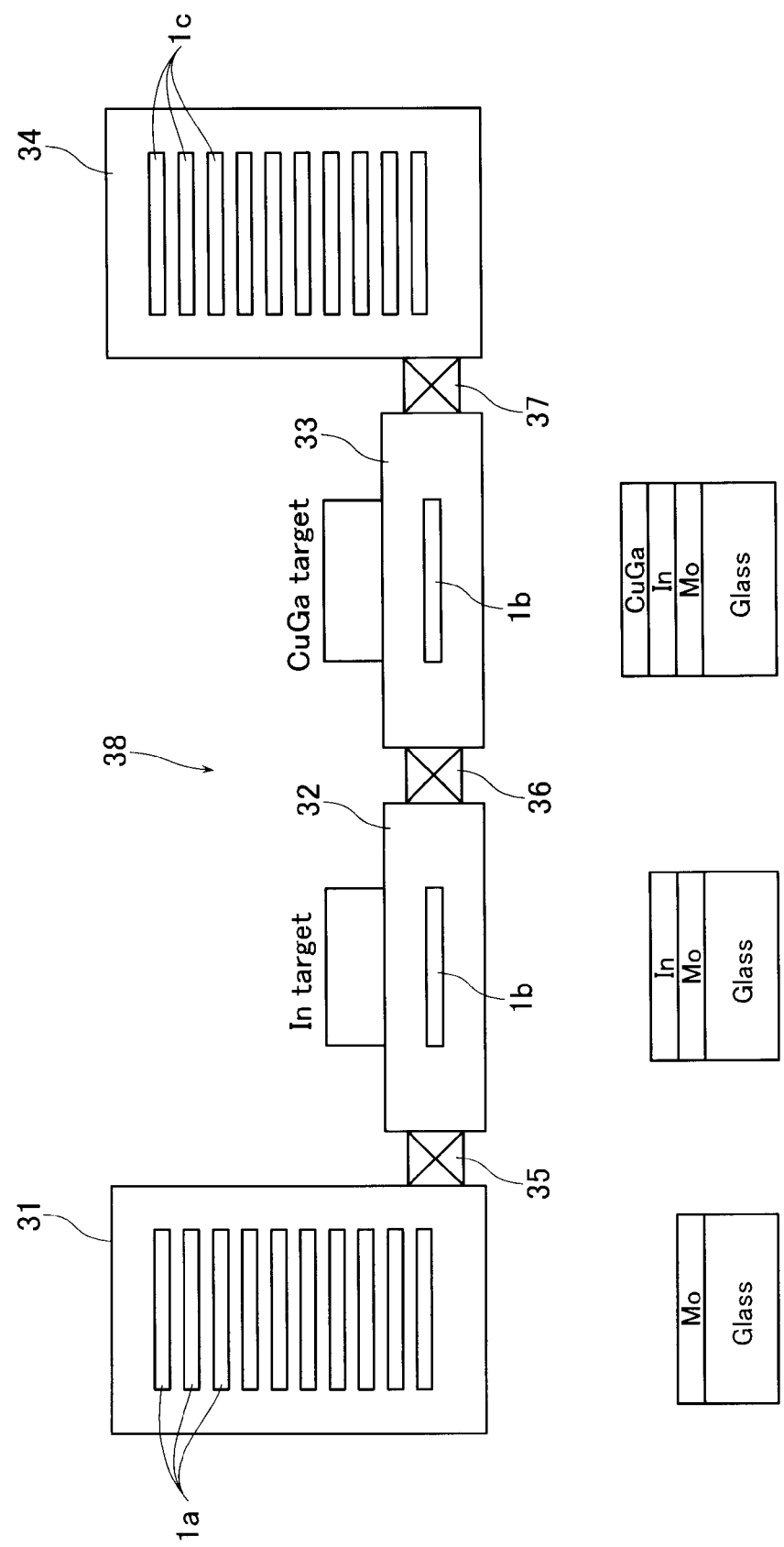
FIG. 4 is a schematic diagram of an inline sputter deposition apparatus for forming a layered precursor which consists of an In metal layer and a Cu—Ga alloy layer.

A deposition apparatus for fabricating the precursor of the light absorbing layer in the present invention is illustrated in FIG. 4.

FIG. 4 is a schematic diagram of an inline sputter deposition apparatus 38, which is in communication with a supply chamber 31, a first sputter deposition chamber 32, a second sputter deposition chamber 33 and a receiving chamber 34 via respective partition valves 35, 36 and 37. Each of chambers 31, 32, 33, and 34 of the sputtering apparatus 38 are respectively connected to a vacuum evacuation mechanism outside the diagram.

The supply chamber 31 contains substrate supports (not shown) which can receive a plurality of batch substrates 1*a*. The substrates 1*a* housed in the supply chamber 31 have already undergone Mo electrode layer deposition. Among the batch substrates 1*a*, substrates 1*b* for deposition are individually transported to the first deposition chamber 32 via the partition valve 35 while being held on a substrate holder (not shown), such as a substrate transport tray.

In the first deposition chamber 32, in a state such that the partition valves 35 and 36 of both sides are open, a metal In layer is deposited onto the Mo electrode layer surface on the substrate 1*b* by sputtering an In target under predetermined pressure conditions in Ar gas or the like. In the same manner, in the second deposition chamber 33, a Cu—Ga layer is deposited onto the In layer surface on the substrate 1*b* by sputtering an Cu—Ga alloy target, whereby the precursor deposition steps are completed. The metal Ga alloy component ratio in the Cu—Ga alloy target is preferably in a range of 1 to 50 atom %.

The post-deposition substrate 1*c* is transported to the receiving chamber 34 via the partition valve 37. In the receiving chamber 34, the same substrate supports as that in the supply chamber 31 is mounted, and a plurality of substrates 1c equivalent to the number of batch units are housed on the support mount.

Although in the present embodiment the metal In layer was deposited in the first deposition chamber 32 and the Cu—Ga alloy layer was deposited in the second deposition chamber 33, the present invention is not limited to this. For example, the metal In layer may be deposited after the Cu—Ga alloy layer, or, a Cu—In—Ga multi-component alloy layer can be deposited in one process. Furthermore, the deposition method is not limited to sputtering. Other dry deposition methods can be employed, such as vapor deposition, CVD or a similar method.

Next, an alkali-metal solution is attached onto the resultant precursor on the substrate by a coating method, such as dipping or the like. Examples of a solvent for containing the alkali-metal compound include, in addition to water, organic solvents, such as ethanol, propanol, acetone, MEK, dimethylformamide and the like. An aqueous solvent combining any one of these organic solvents with water is also acceptable. Among these solvents, water is preferred, whereby, for example, the alkali layer can be formed by dipping a substrate provided with a precursor in an aqueous solution of 0.1 to 5% by weight of sodium tetraborate, and then drying the dipped substrate by spin drying or the like.

Examples of the alkali-metal solution solute include the following alkali metal compounds. It is noted that the hydrates may be used in an anhydride form.

Sodium compounds: $Na_2B_4O_7.10H_2O$, $Na_2S.9H_2O$, $Na_2SeO_3.5H_2O$, $Na_2TeO_3.5H_2O$, $Na_2SO_3.7H_2O$, $AlNa(SO_4)_2.12H_2O$, and $NaCl$.

Potassium compounds: $K_2TeO_3.3H_2O$, $K_2Al_2O_4.3H_2O$, $AlK(SO_4)_2.12H_2O$, $KOH$, $KF$, $K_2SeO_3$, $K_2TeO_3$, $KCl$, $K_2[CuCl_4(H_2O)_2]$, $KBr$, $KBH_4$, $K_2S_2O_3.nH_2O$, $K_2S_2O_5$, $K_2S_2O_7$, $KF.2H_2O$, $KF.HF$, $K_2TiF_6$, $K_2B_4O_7.4H_2O$, $KHSO_4$, and $KI$.

Lithium compounds: $Li_2B_4O_7.3H_2O$, $Li_2B_4O_7$, $LiCl$, $LiBr.H_2O$, $LiF$, and $Li_2SO_4.H_2O$.

These alkali metal compounds may be used singly or in combination of two or more kinds thereof. Among these compounds, when sodium tetraborate decahydrate, sodium sulfide nonahydrate or sodium aluminium sulfate dodecahydrate, or the anhydrides thereof, are used, a high photoelectric conversion efficiency can be attained.

Figure 5:
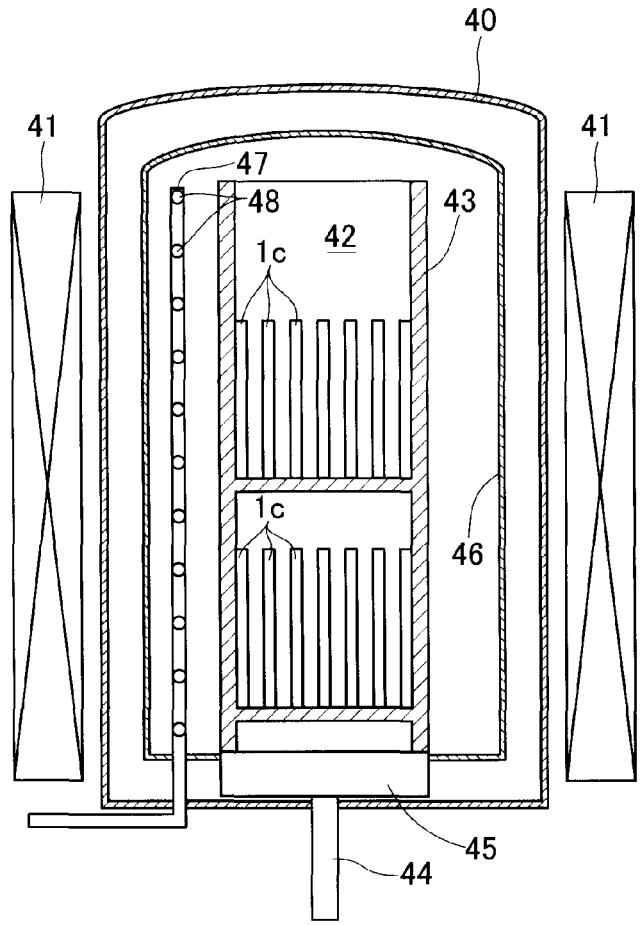
FIG. 5 is a schematic diagram of a heat-treatment chamber for forming a CIGS light absorbing layer.

Next, the substrate on which an alkali layer has been formed is subjected to a selenization treatment. FIG. 5 is a schematic diagram of a heat-treatment chamber 40 for carrying out the selenization of the precursor according to the present invention, which corresponds to the selenization step of the precursor for the light absorbing layer illustrated in FIG. 2e. The heat-treatment chamber 40 is heated by heaters 41 provided at both sides thereof. Furthermore, the substrates 1c of the batch units are housed in a quartz boat 42 using a carrier robot, after which the quartz boat 42, in which a plurality of substrates 1c are housed in an upright manner on its bottom face, is inserted from a lower part of the heat-treatment chamber, whereby the quartz boat 42 is arranged in the interior of the heat-treatment chamber 40. A susceptor 43 is further provided to keep the substrates 1c on the boat 42 standing upright. A rotation drive shaft 44 connected to an external drive mechanism is connected via a connecting member 45 to the quartz boat 42 equipped with this susceptor 43, whereby the drive of the rotation shaft 44 allows the boat 42 to rotate while maintaining the substrates 1c in an upright state.

The quartz boat 42 mounted with the substrates 1c is surrounded by a process tube 46 made from quartz. The pressure conditions of the sealed space surrounded by the process tube 46 can be varied using a vacuum evacuation mechanism which is external to the diagram. A gas introduction line 47 for charging the hydrogen selenide gas into this sealed space passes through the process tube 46. Many nozzle apertures 48 pierce into the peripheral wall of the gas introduction line 47, whereby hydrogen selenide gas flows from the nozzle apertures 48 into the process tube 46. So that a uniform circulation of the hydrogen selenide gas in the process tube 46 can be attained, the diameter of the nozzle apertures 48 is in a range of 1 to 2 mm.

Figure 6:
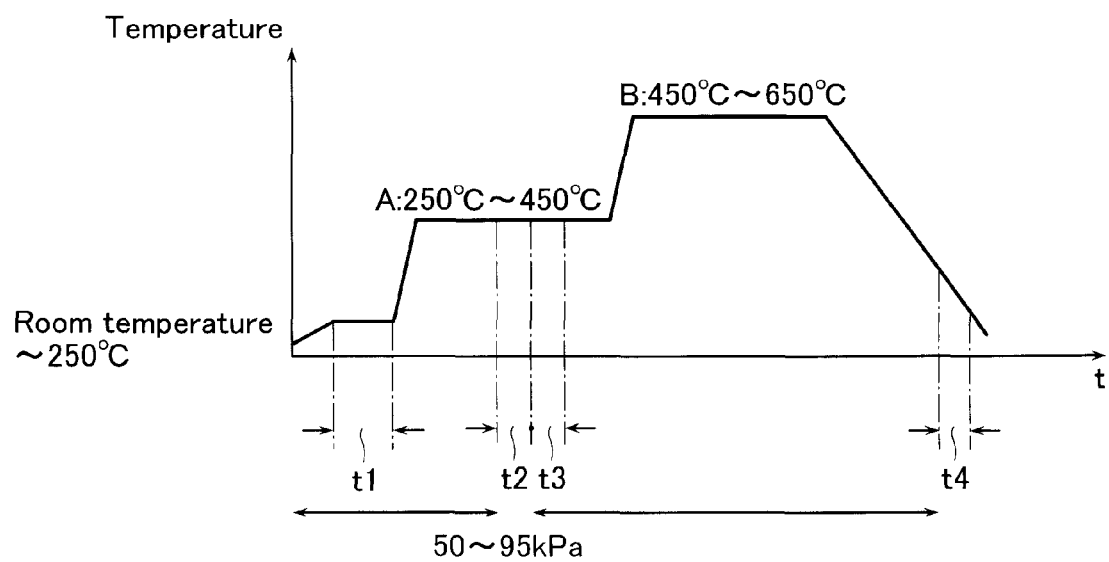
FIG. 6 is a temperature profile diagram of a selenization treatment.

During formation of the light absorbing layer 4 (see FIG. 1), a predetermined number of glass substrates 1c, which have been layered with an In metal layer, a Cu—Ga alloy layer and an alkali layer, are housed in the heat-treatment chamber 40 illustrated in FIG. 5. Subsequently, a selenization treatment is conducted in accordance with the temperature profile illustrated in FIG. 6.

That is, the internal temperature of the process tube 46 is elevated using a heater 41 to a temperature in the range of room temperature to 250° C., more preferably from 30 to 150° C. In a state wherein the temperature is maintained in this range, and while maintaining the process tube 46 interior at a reduced pressure of 50 to 95 kPa through the action of the vacuum evacuation mechanism, hydrogen selenide gas is introduced at a predetermined rate over time $t_1$ from the nozzle apertures 48 of the gas introduction line 47. This first selenization step is provided to stabilize the hydrogen selenide gas atmosphere in the heat-treatment chamber 40, and to preheat the heat-treatment chamber 40 when elevating the temperature from room temperature to a high temperature. The time $t_1$ is preferably about, for example, 10 minutes.

In the first selenization step, by making the rotation drive shaft 44 rotate at a speed of from 1 to 2 rpm, the surrounding environment of the substrates 1c being simultaneously rotated, i.e. the hydrogen selenide gas environment, can be further stabilized. By rotating the substrates 1c in not only the first selenization step, but also in the below-mentioned second and third selenization steps as well as the cooling step, the annealing treatment of the substrates 1c becomes even more effective.

Next, after the first selenization step has been completed, the internal temperature A of the process tube 46 is elevated using the heater 41 to a temperature in the range of 250° C. to 450° C., more preferably from 300 to 450° C. In a state wherein the internal temperature A is maintained at a predetermined temperature within this range, and while maintaining the process tube 46 interior at a reduced pressure of 50 to 95 kPa, hydrogen selenide gas is introduced from the nozzle apertures 48 for, for example, 10 to 120 minutes. This second selenization step is provided to incorporate a Se component into the precursor for the light absorbing layer, which consists of a layered structure of an In layer and a Cu—Ga layer formed on the substrates 1c, while diffusing the respective In, Cu and Ga components therein.

During the second selenization step, the supply of hydrogen selenide gas is stopped, and the hydrogen selenide is once evacuated by an intervening vacuum step, which maintains the process tube 46 interior in a high vacuum state, for about a time $t_2$. A predetermined amount of fresh hydrogen selenide gas is subsequently reintroduced from the nozzles 48 for a time $t_3$. By making the process tube 46 interior to be in a high vacuum state at the time $t_2$ vacuum step immediately before the time $t_3$, the hydrogen selenide gas activity of the Se component incorporated during the second selenization step increases. In addition, since the remaining gas derived from the first selenization step has been already eliminated, by introducing a predetermined amount of hydrogen selenide gas, the Se component incorporation in the second selenization step can be strictly controlled. Furthermore, when the amount of hydrogen selenide gas introduced during the second selenization step is comparatively large, the gas may be introduced in portions to strictly control its flow rate. In such a case, it is necessary to make the process tube 46 interior into the above-mentioned high vacuum state immediately prior to the introduction of each portion. This results in the flow amount of hydrogen selenide gas being even more strictly controlled.

Although in the present embodiment the vacuuming time $t_2$ was set at 1 minute, the time $t_2$ can be shortened using a high-performance vacuum apparatus, as the In and other components evaporate off from the precursor during treatment when maintained in a high-temperature vacuum state.

Next, after the second selenization step has been completed, and without evacuating the hydrogen selenide gas which remains in the process tube 46 interior, the internal temperature B of the process tube 46 is elevated using a heater 41 to a temperature in the range of 450° C. to 650° C., more preferably from 500 to 650° C. while maintaining the process tube 46 interior at a reduced pressure of 50 to 95 kPa. The internal temperature B is maintained at a predetermined temperature within this temperature range for 10 to 120 minutes. This third selenization step is provided to recrystallize the precursor for the light absorbing layer, which has been made uniform by the diffusion of the respective In, Cu and Ga components and by the incorporation of the Se component which have occurred up until this stage, whereby the reconstitution of the internal film structure can be stably achieved.

The temperature in the process tube 46 is subsequently slowly lowered, and allowed to cool down to room temperature. The substrates 1c formed with a light absorbing layer are then removed. While this is being carried out, in some cases remaining hydrogen selenide gas acts on the substrates 1c which are cooling down, whereby undesirable Se precipitate is formed on the surface of the substrates. To prevent this, at a time $t_4$ during the cooling step, the process tube 46 can be evacuated to be under a high vacuum. Furthermore, it is preferred to carry out the rotation of the quartz boat 42 at a uniform rotation of the rotation drive shaft 44 until immediately prior to the removal of the substrates 1c.

It is noted that the alkali layer diffuses into the adjacent light absorbing layer during the selenization treatment, and thereby disappears.

Figure 7:
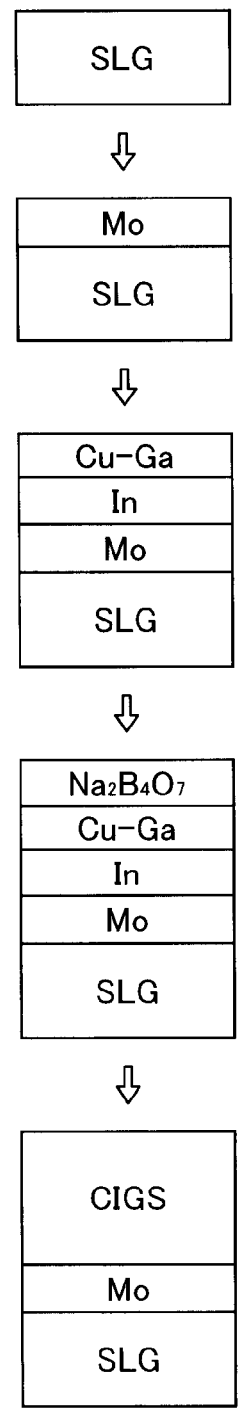
FIG. 7 is a production process diagram of the light absorbing layer according to the present invention which comprises forming an alkali layer by a wet process.

One example of the processes up until forming the above-mentioned light absorbing layer is illustrated in the process diagram of FIG. 7.

First, a Mo electrode layer is formed onto an SLG substrate by sputtering. Next, using the inline sputter deposition apparatus illustrated in FIG. 4, a layered precursor consisting of an In metal layer and a Cu—Ga alloy layer is formed on the Mo electrode layer. An alkali layer is then formed by a dipping, wherein a substrate on which the precursor has been deposited is dipped into a liquid medium containing an alkali metal compound, such as sodium tetraborate, sodium sulfide and sodium aluminum sulfate. Specifically, for example, a substrate provided with the precursor is dipped into a 0.1 to 5% by weight aqueous solution obtained by dissolving sodium tetraborate decahydrate in pure water, and then dried by a spin-drying method. Next, the substrate on which the alkali layer was formed is subjected to a selenization treatment in a Se atmosphere in accordance with the temperature profile illustrated in FIG. 6 using the heat-treatment apparatus illustrated in FIG. 5, whereby a CIGS light absorbing layer is formed. At this stage, the sodium tetraborate disappears by diffusion into the adjacent light absorbing layer.

Next, an n-type buffer layer is layered if necessary. Furthermore, by sputtering a ZnO—Al alloy target, an n-type conductive transparent electrode layer comprising a ZnOAl layer as its outermost layer is layered, whereby a thin-film solar cell is fabricated.

In the present embodiment, a dipping, represented by chemical bath deposition, is employed in the step of attaching the alkali-metal solution, but the present invention is not limited to this. As long as it is a wet process, any type of coating may be employed, such as, for example, brush coating, roller coating, spray coating, casting, blade coating and inkjet coating.

Furthermore, in addition to soda lime glass (SLG), alkali-containing glass (alkali metal content percentage of from 1 to 10%; soda lime glass etc.) or low-alkali glass (alkali metal content of from 0.03 to 1%; white sheet glass etc.) can also be used as the substrate. In some cases stainless steel or other such metal substrate can also be used.

A thin-film solar cell having improved photoelectric conversion efficiency can comparatively easily be achieved by appropriately varying the concentration of the alkali-metal solution, which forms the alkali layer, depending on the substrate material.

EXAMPLES

Example 1

Using the inline sputter deposition apparatus illustrated in FIG. 4, a layered precursor consisting of an In metal layer and a Cu—Ga alloy layer was formed on an SLG substrate. Next, the SLG substrate on which the precursor had been deposited was dipped into a 0.8% by weight aqueous solution obtained by dissolving sodium tetraborate decahydrate in pure water, and the attached aqueous solution was then dried by a spin-drying method. After this, a selenization treatment was carried out in accordance with the temperature profile illustrated in FIG. 6 using the heat-treatment apparatus illustrated in FIG. 5.

Figure 8:
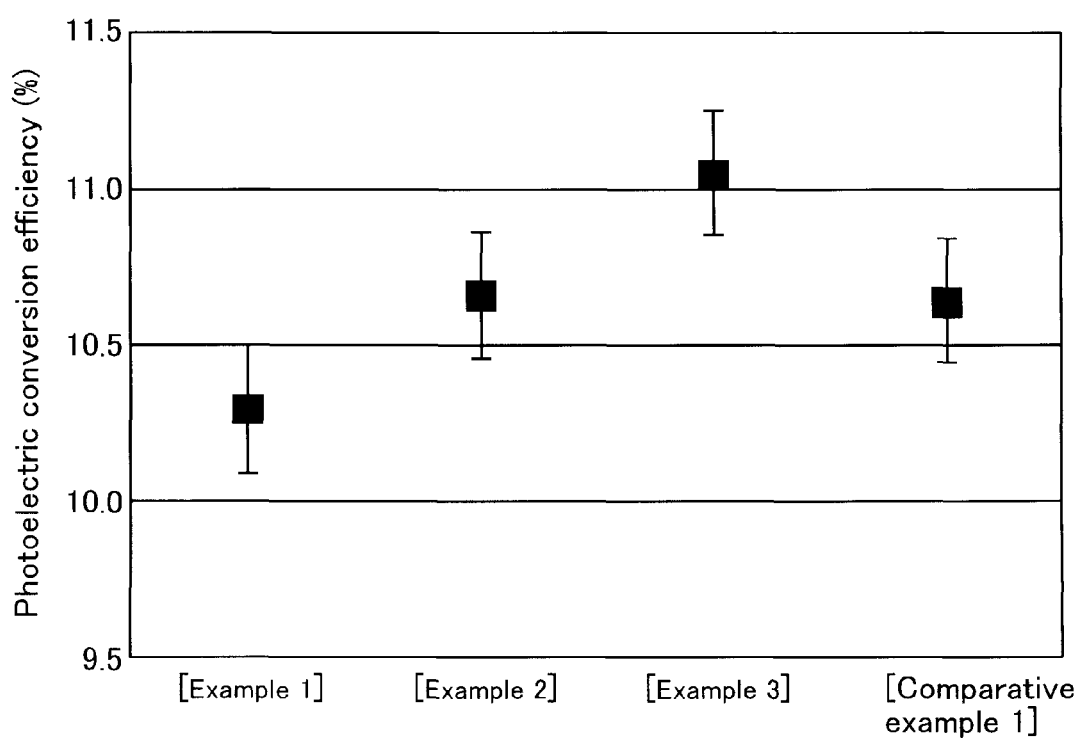
FIG. 8 is a graph illustrating the photoelectric conversion efficiency of the thin-film solar cells according to Examples 1 to 3 and Comparative Example 1.

Onto the thus formed light absorbing layer, a buffer layer and a conductive transparent electrode layer were deposited in that order, to thereby fabricate a thin-film solar cell. This thin-film solar cell had a stable film internal structure, and exhibited an external appearance free from stain spots. Measurement of the photoelectric conversion efficiency for 8 thin-film solar cells fabricated under the same conditions gave, as illustrated in FIG. 8, a photoelectric conversion efficiency of 10.28%.

Examples 2 and 3

A thin-film solar cell was fabricated under the same conditions as in Example 1, except that the concentration of sodium tetraborate was changed to 1.6% by weight and 2.4% by weight, respectively. These thin-film solar cells had a stable film internal structure, and exhibited an external appearance free from stain spots. Measurement of the respective photoelectric conversion efficiencies for 8 thin-film solar cells fabricated under the same conditions gave, as illustrated in FIG. 8, a photoelectric conversion efficiency of 10.66% and 11.05%.

COMPARATIVE EXAMPLE 1

Figure 3:
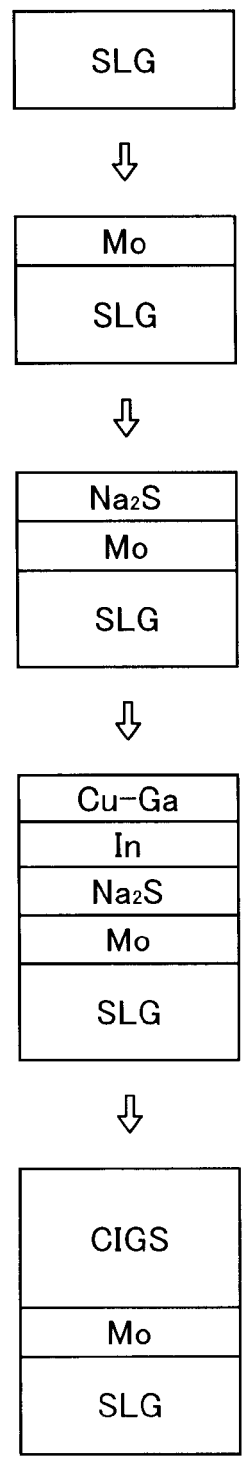
FIG. 3 is a production process diagram of a conventional light absorbing layer comprising forming an alkali layer by a wet process.

In place of the Na$_2$S layer illustrated in FIG. 3, an alkali layer was formed using the 0.8% by weight aqueous solution of sodium tetraborate of Example 1. That is, aqueous sodium tetraborate was attached onto a Mo electrode layer, and this layer was dried by spin drying. The dried layer was then baked in air for 60 minutes. The remaining moisture was regulated, whereby an alkali layer was formed consisting of sodium tetraborate. Subsequently, the alkali layer was subjected to sputter deposition using, in order, an In target followed by a Cu—Ga alloy target, whereby a layered precursor was formed consisting of an In metal layer and a Cu—Ga alloy layer. The substrate on which a precursor layer had been formed was then subjected to a selenization treatment in a Se atmosphere having a predetermined temperature, whereby a CIGS light absorbing layer was formed.

Onto the thus formed light absorbing layer, a buffer layer and a conductive transparent electrode layer were deposited in that order, to thereby fabricate a thin-film solar cell. Measurement of the photoelectric conversion efficiency for 8 thin-film solar cells fabricated under the same conditions gave, as illustrated in FIG. 8, a photoelectric conversion efficiency of 10.64%.

Stain spots were visible on the surface of the thin-film solar cell according to Comparative Example 1. Furthermore, among Examples 1 to 3, Example 3, which had a sodium tetraborate concentration of 2.4% by weight, showed the highest thin-film solar cell photoelectric conversion efficiency.

Furthermore, in Examples 2 and 3, sodium tetraborate had a concentration more than 1.0% by weight in terms of Na concentration, which was considered as the upper limit of the Na concentration to maintain film structure stability. Despite this, there was no internal peeling in the film structure of the thin-film solar cells fabricated in these Examples, which were stable for an extended period of time.

Example 4

A thin-film solar cell article was fabricated under the same conditions as in Example 1, except that the substrate was changed to a low-alkali glass, such as white sheet glass. At this time, by making various changes to the concentration of sodium tetraborate forming the alkali layer, high respective photoelectric conversion efficiency was exhibited when the concentration was from 3.2 to 4.3% by weight.

Since the substrate material was a low-alkali glass, the alkali component supplied from diffusion into the light absorbing layer from the substrate was insufficient. However, such a high photoelectric conversion efficiency was attained since the highly concentrated aqueous sodium tetraborate supplemented it.

Consequently, photoelectric conversion efficiency can be improved comparatively easily by appropriately varying the concentration of an alkali-metal solution, which forms the alkali layer, depending on the substrate material, which may be alkali-containing glass, low-alkali glass or the like. Furthermore, even when a non-alkali metal-based substrate, such as stainless steel or other metal substrate, or a resin substrate, is used, by employing a high-concentration alkali-metal solution as an alkali layer forming material, it is possible to fabricate a thin-film solar cell having a high photoelectric conversion efficiency.

INDUSTRIAL APPLICABILITY

The present invention can be utilized in the fabrication of a thin-film solar cell, whose light absorbing layer consists of a chalcopyrite-type compound (CIGS), wherein, in particular, a thin-film solar cell can be fabricated which has no external appearance defects and which has a stable internal structure. In addition, it is possible to comparatively easily fabricate a thin-film solar cell having a high photoelectric conversion efficiency depending on the substrate material.

The invention claimed is:

1. A method for fabricating a chalcopyrite-type thin-film solar cell, comprising a first step of forming a precursor comprising In, Cu and Ga metal elements onto a backside electrode layer provided on a substrate, a second step of attaching an alkali-metal solution onto the precursor, a selenization step of heat-treating the substrate which has undergone both the first and the second steps in a hydrogen selenide atmosphere, and a transparent electrode forming step of depositing an optically transparent conductive layer.

2. The method for fabricating a chalcopyrite-type thin-film solar cell according to claim 1, wherein a solute for the alkali-metal solution is at least one alkali metal compound selected from the group consisting of sodium tetraborate, sodium sulfide, and sodium aluminum sulfate.

3. The method for fabricating a chalcopyrite-type thin-film solar cell according to claim 1, wherein the first step comprises a first sputter deposition step for forming an In metal layer and a second sputter deposition step for forming a Cu—Ga alloy layer.

4. The method for fabricating a chalcopyrite-type thin-film solar cell according to claim 2, wherein the first step comprises a first sputter deposition step for forming an In metal layer and a second sputter deposition step for forming a Cu—Ga alloy layer.

5. The method for fabricating a chalcopyrite-type thin film solar cell according to claim 1, wherein the concentration of alkali metal in the alkali-metal solution exceeds 1.0% by weight.

* * * * *